United States Patent
Achter

(10) Patent No.: US 8,116,151 B2
(45) Date of Patent: Feb. 14, 2012

(54) MULTI-LEVEL STORAGE ALGORITHM TO EMPHASIZE DISTURB CONDITIONS

(75) Inventor: Michael Achter, Mountain View, CA (US)

(73) Assignee: Spansion LLC, Sunnyvale, CA (US)

(*) Notice: Subject to any disclaimer, the term of this patent is extended or adjusted under 35 U.S.C. 154(b) by 856 days.

(21) Appl. No.: 12/189,746

(22) Filed: Aug. 11, 2008

(65) Prior Publication Data

US 2010/0037032 A1  Feb. 11, 2010

(51) Int. Cl.
*G11C 7/00* (2006.01)

(52) U.S. Cl. ......... 365/189.16; 365/185.21; 365/185.18; 365/185.24; 365/189.07; 365/189.09

(58) Field of Classification Search ............ 365/185.21, 365/185.18, 185.01, 185.02, 185.03, 185.14, 365/185.17, 185.2, 185.22, 185.23, 185.24, 365/185.28, 185.33, 185.15, 189.16, 189.07, 365/189.09; 711/170, E12.001

See application file for complete search history.

(56) References Cited

U.S. PATENT DOCUMENTS

| | | | | |
|---|---|---|---|---|
| 7,631,023 B1* | 12/2009 | Kaiser et al. | ................. | 1/1 |
| 7,930,507 B2* | 4/2011 | Perry | ................. | 711/167 |
| 2009/0016140 A1* | 1/2009 | Qureshi et al. | ................. | 365/227 |

* cited by examiner

*Primary Examiner* — Fernando Hidalgo
(74) *Attorney, Agent, or Firm* — Turocy & Watson, LLP

(57) ABSTRACT

Providing systems and methods that reduce memory device read errors and improve memory device reliability by intelligently disturbing the memory cells during storage of their characteristic states. A specification component can determine a desired characteristic state for each cell of a plurality of multi-cell memory devices. A storage component can, alternatively, successively store an equivalent characteristic state in each cell of the plurality of multi-cell memory devices in stages, based on a cell's current characteristic state, or directly store the desired characteristic state of each cell of the plurality of multi-cell memory devices, based on an ordering of desired characteristic states of cells of the multi-cell memory devices. Further, a step component can gradate the equivalent characteristic state between successive storage stages. In this way, the overlap of distributions of electrical characteristics associated with different bits of one or more memory cells can be reduced.

20 Claims, 13 Drawing Sheets

MULTI-LEVEL STORAGE ALGORITHM TO EMPHASIZE DISTURB CONDITIONS

TECHNICAL FIELD

This disclosure relates generally to storing characteristics in memory devices and in particular, but not exclusively, relates to systems and methods for implementing a multi-level storage algorithm to emphasize disturb conditions.

BACKGROUND

Memory devices are ubiquitous in a wide variety of modern electronic devices such as cellular phones, personal computers, laptops, personal digital assistants, camcorders, voice recorders, media players, and portable storage devices. Non-volatile memory devices (e.g., erasable programmable read-only memory (EPROM), electrically erasable programmable read-only memory (EEPROM), and Flash memory) do not require power to retain information, and have become a useful and popular mechanism for storing, transporting, sharing, and maintaining data. Flash memory has become a popular device for consumer electronics, due in part, because it combines the benefits of EPROM (high density and low cost) with the benefits of EEPROM (electrical erasability).

Multiple storage flash memory cells, also known as multi-bit, multi-cell, and/or multi-level memory cells, have been developed to meet the demand for higher density storage devices. Multiple storage flash memory technology enables a single flash memory transistor to store more than one bit, and thus more than two logic states, in the transistor. For example, a 2-bit flash memory transistor can store four logic states (e.g., 00, 01, 11, 10), each state represented by a quantized voltage or current level. Logic states can be stored (i.e., erased or programmed) into a multiple storage flash memory transistor by controlling a level of electrical charge applied to or removed from one or more floating gates of the transistor.

One concern with conventional multiple storage flash memory technology is that programming or erasing a characteristic (e.g., logic state) of one bit of a memory cell can indeterministically disturb characteristics of other bits of the memory cell, reducing memory cell program/erase accuracy. Another concern with conventional multiple storage flash memory technology is that this reduced memory cell program/erase accuracy reduces control over the distribution of stored memory cell characteristics. For example, logic states are determined, or sensed, as a function of distributions of stored logic states; therefore, memory read errors can result when distributions of stored logic states associated with different bits of one or more memory cells overlap.

It is therefore desirable to have systems and methods that increase device reliability by improving the accuracy of storing characteristics in multiple storage flash memory cells. Further, it is desirable to reduce multiple storage flash memory cell read errors by more effectively controlling distributions of stored memory cell characteristics.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The claimed subject matter relates to systems and methods for improving multi-cell memory device reliability. Conventional multiple storage flash memory technology is susceptible to memory read errors because memory cell characteristics are indeterministically disturbed during program/erase of such characteristics. The lack of control over program/erase disturb can cause an overlap of distributions of programmed/erased characteristics, resulting in memory read errors. In contrast, the subject matter disclosed herein provides for increased memory device reliability by intelligently disturbing memory cells during storage of memory cell characteristics.

In accordance with one aspect of the claimed subject matter, computer executable methods and systems can determine a desired characteristic state for each cell of a plurality of multi-cell memory devices. Such methods and systems can, alternatively, successively store an equivalent characteristic state in each cell of the plurality of multi-cell memory devices in consecutive storage stages, based on, at least in part, a cell's current characteristic state, or directly store the desired characteristic state of each cell of the plurality of multi-cell memory devices, based on an ordering of the desired characteristic states of cells of the multi-cell memory devices. The equivalent characteristic state can be gradated between successive storage stages. In such a manner, read errors associated with overlapped memory cell state distributions can be mitigated since desired characteristic states are successively or directly stored in a deterministic manner.

In accordance with another aspect of the claimed subject matter, an analysis component can determine a size of gradation of the equivalent characteristic state. In accordance with yet another aspect of the claimed subject matter, the gradation can include a linear or non-linear gradation. In one aspect of the claimed subject matter, successive values of the equivalent characteristic state can be incrementally/decrementally stored in each cell of the plurality of multi-cell memory devices during each consecutive storage stage. Further, characteristic states can be directly stored in each cell of the plurality of multi-cell memory devices in order from highest/lowest desired characteristic state of the plurality of memory devices to lowest/highest desired characteristic state of the plurality of memory devices. In accordance with yet another aspect of the claimed subject matter, an equivalent characteristic state can be stored in a cell based on whether the cell's current characteristic state is not equal to its desired characteristic state.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and novel features of the disclosed subject matter will become apparent from the following detailed description of the innovation when considered in conjunction with the drawings.

DETAILED DESCRIPTION

Figure 1:
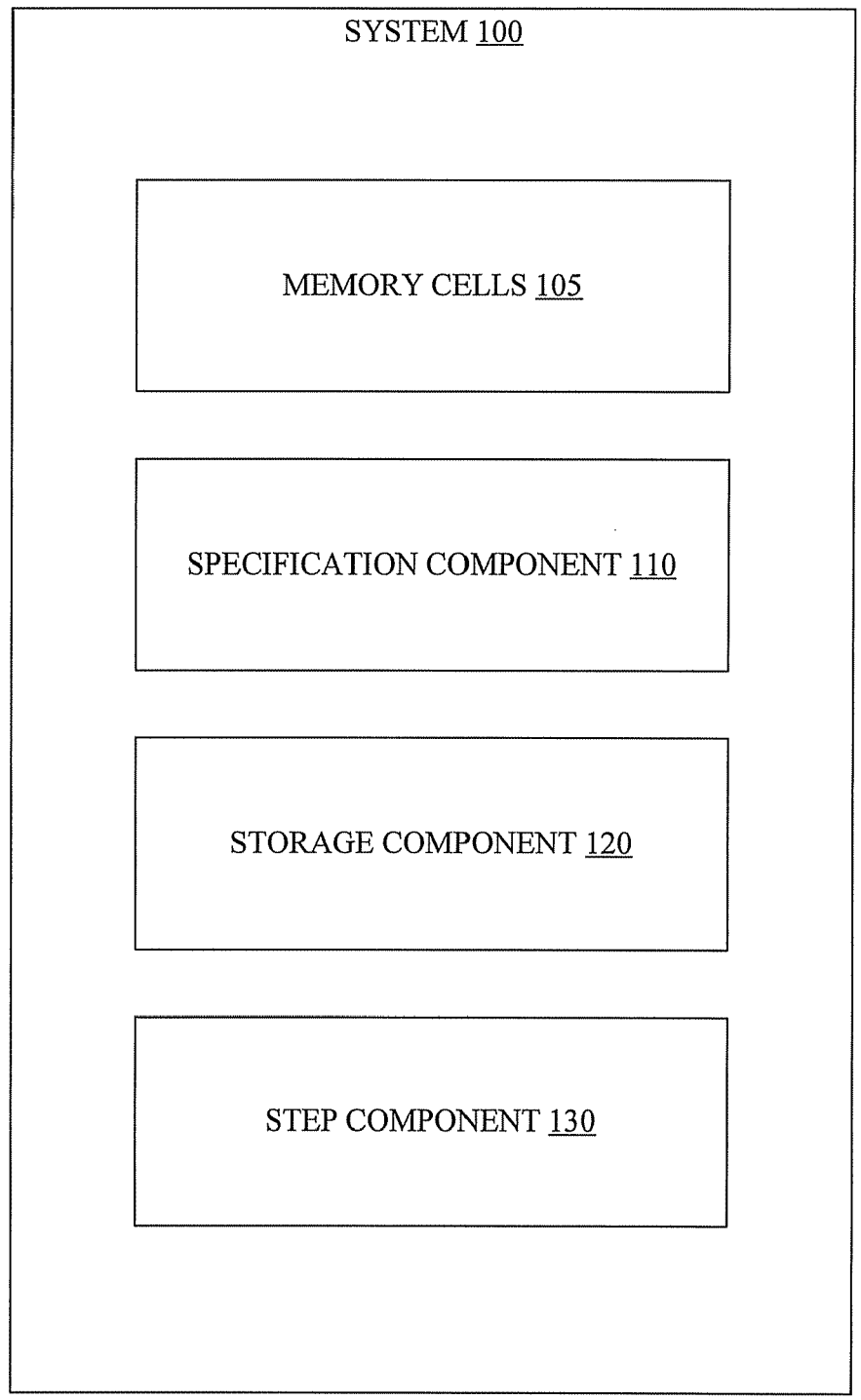
FIG. 1 is a demonstrative system for intelligently disturbing memory cells to obtain optimal cell characteristic distributions, in accordance with an embodiment of the invention.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

As utilized herein, terms "component," "system," "interface," "engine," and the like are intended to refer to a computer-related entity, either hardware, a combination of hardware and software, software (e.g., in execution), and/or firmware. For example, a component can be a process running on a processor, a processor, an object, an executable, a program, and/or a computer. By way of illustration, both an application running on a server and the server can be a component. One or more components can reside within a process and/or thread of execution and a component can be localized on one computer and/or distributed between two or more computers. As another example, an interface can include I/O components as well as associated processor, application and/or API components, and can be as simple as a command line or a more complex Integrated Development Environment (IDE).

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Of course, those skilled in the art will recognize many modifications may be made to this configuration without departing from the scope or spirit of the claimed subject matter.

Moreover, reference throughout this specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout this specification are not necessarily all referring to the same embodiment. Furthermore, the particular features, structures, or characteristics may be combined in any suitable manner in one or more embodiments.

In addition, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. Further, as used in this application, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

The subject invention provides systems and methods that reduce memory device read errors and improve memory device reliability by intelligently disturbing memory cells during storage of memory cell characteristics. In accordance with aspects of the claimed subject matter, a specification component can determine a desired characteristic state for each cell of a plurality of multi-cell memory devices. A storage component can, alternatively, successively store an equivalent characteristic state in each cell of the plurality of multi-cell memory devices in stages, based on the cell's current characteristic state, or directly store the desired characteristic state of each cell of the plurality of multi-cell memory devices, based on an ordering of desired characteristic states of cells of the multi-cell memory devices. Further, a step component can gradate the equivalent characteristic state between successive storage stages. By controlling the disturb of memory cells in this way, the overlap of distributions of electrical characteristics associated with different bits of one or more memory cells can be reduced—thus reducing memory cell read errors.

FIG. 1 is a demonstrative system 100 for intelligently disturbing a plurality of multi-cell memory devices 105 to obtain optimal cell distributions, in accordance with an embodiment of the invention. System 100 and the systems and processes explained below may constitute machine-executable instructions embodied within a machine (e.g., computer) readable medium, which when executed by a machine will cause the machine to perform the operations described. Additionally, the systems and processes may be embodied within hardware, such as an application specific integrated circuit ("ASIC") or the like. The order in which some or all of the process blocks appear in each process should not be deemed limiting. Rather, it should be understood by a person of ordinary skill in the art having the benefit of the instant disclosure that some of the process blocks may be executed in a variety of orders not illustrated.

In system 100, the plurality of multi-cell memory devices 105 can include non-volatile memory, such as flash memory, read only memory (ROM), programmable ROM (PROM), erasable programmable read only memory (EPROM), electronically erasable programmable read only memory (EEPROM), and the like. As an example, multi-cell memory devices 105 can include non-volatile memory (e.g., flash memory, multi-bit flash memory, quad-bit flash memory, and like memory) that further includes multi-level, multi-bit flash memory cells.

System 100 can include specification component 110 that can determine a desired characteristic state for each cell of multi-cell memory devices 105. In one embodiment, the desired characteristic state for each cell can include at least one of a value of threshold voltage, current, gain, electric field, body effect, change in threshold voltage, resistance, impedance, inductance, temperature coefficient, or change in current. It is to be appreciated that distributions of desired characteristic states (e.g., threshold voltage), once stored into the plurality of multi-cell memory devices 105, can typically shift as a result of such storage.

For example, a high degree of shifting can occur when a cell of multi-cell memory devices 105 is programmed at a highest state (e.g., high threshold voltage ($V_T$) level, current level, etc.) and an adjacent cell is programmed at a lowest state (or un-programmed level), resulting in an overlap of state distributions. Conventional techniques for reading memory cell data can typically measure and identify a concurrent program level of a memory cell or group of memory cells so long as states of such cells do not overlap. However, once programmed states and/or state distributions begin to overlap and become indistinguishable from each other, read errors can occur—resulting in potential data corruption and/or data loss. It should be appreciated by those skilled in the art that shifting can also occur when a cell of multi-cell memory devices 105 is erased from a highest state and an adjacent cell is erased from a lower state.

As a specific example to provide context for aspects of system 100, in one embodiment, multi-cell memory devices 105 can comprise quad-bit cells that can be programmed to four discrete levels (e.g., B1, B2, B3, and B4), each level corresponding to a characteristic states (e.g., $V_T$ state). A B1 level can correspond to a first programmed state (e.g., a lowest amount of threshold voltage, a default threshold voltage level, an un-programmed state, or combinations thereof), and subsequent levels, such as a B2 level, can correspond to a programmed characteristic state higher or lower than the characteristic state represented by the B1 level (e.g., a higher threshold voltage than the threshold voltage associated with the B1 level).

Additionally, a B3 level can correspond to a programmed state associated with a threshold voltage higher than the threshold voltages associated with the B1 and B2 levels. Further, a B4 level can correspond to a highest programmed state associated with a threshold voltage higher than the threshold voltages associated with the B1, B2, and B3 levels. Each bit level (e.g., B1 through B4) of a multi-bit device can correspond to different digital information, or data. It should be appreciated that the four discrete logic levels can also represent, conversely, a decreasing order of threshold voltages or other programmed characteristics, e.g, a B1 level corresponding to a higher threshold voltage than the threshold voltage associated with a B2 level, etc.). Therefore, quad-bit, dual-cell memory devices can represent a total of 16 state distributions associated with programmed levels of threshold voltage or other memory cell characteristics (e.g., current, gain, electric field, body effect, resistance, impedance, inductance, temperature coefficient, etc.).

Figure 2:
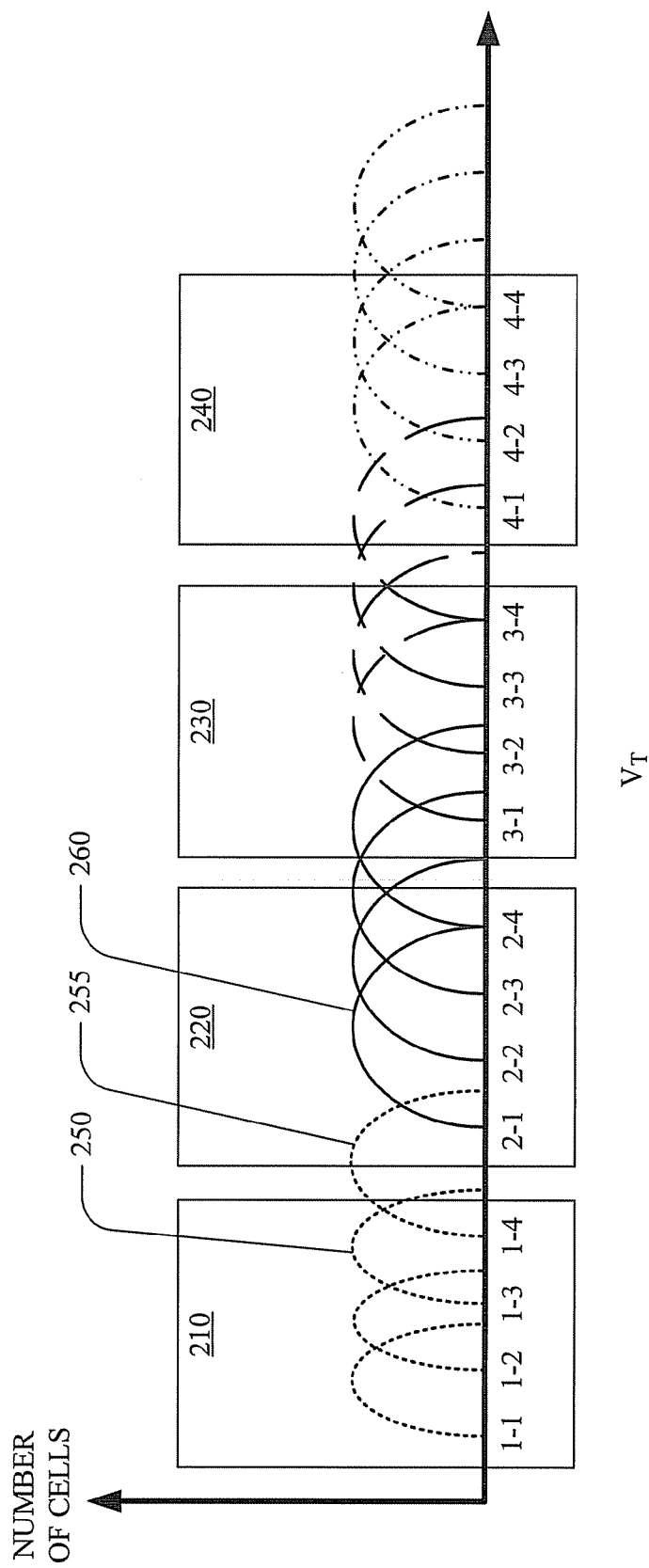
FIG. 2 illustrates an example of overlapping state distributions of characteristics stored in quad-bit, dual-cell memory devices indeterministically disturbed during storage of the characteristics.

FIG. 2 illustrates an example of overlapping state distributions of programmed quad-bit, dual-cell memory devices indeterministically disturbed during programming. It should be appreciated by those skilled in the art that overlapping state distributions can result from erasing quad-bit, dual-cell memory devices indeterministically disturbed during erasure of a memory device. The state distributions are depicted on a graph of threshold voltage (x-axis) versus number of cells (y-axis), and correspond to programmed threshold voltage levels of quad-bit, dual-cell memory devices. State distribution group 210 corresponds to distributions of first cells of the dual-cell memory devices programmed to a first program state (e.g., $V_T$ level), with adjacent cells programmed to first, second, third, and fourth program states (e.g., $V_T$ levels), respectively.

Such state distributions can also be referred to as 1-1, 1-2, 1-3, and 1-4 distributions, respectively. State distribution group 220 corresponds to distributions of first cells of the dual-cell memory devices programmed to a second program state, having adjacent cells programmed to the first, second, third, and fourth program states, respectively (i.e., 2-1, 2-2, 2-3, and 2-4 distributions). Likewise, state distribution group 230 corresponds to distributions of first cells programmed to a third state, having adjacent cells programmed to the first, second, third, and fourth program states, respectively (i.e., 3-1, 3-2, 3-3, and 3-4 distributions). Similarly, distribution group 240 corresponds to distributions of first cells programmed to a fourth state, also having adjacent cells programmed to the first, second, third, and fourth program states, respectively (i.e., 4-1, 4-2, 4-3, and 4-4 distributions).

As depicted by FIG. 2, distributions corresponding to each of 16 program states overlap at least one other programmed state distribution, rendering states of all distributions unverifiable. For example, threshold voltage distribution 255 (corresponding to cells programmed to a 1-4 state) overlaps threshold voltage distribution 260 (corresponding to cells programmed to a 2-1 state)—thus, the state of cells corresponding to the 1-4 and 2-1 state distributions cannot be verified.

Returning now to FIG. 1, storage component 120 can provide for increased memory device reliability by, alternatively, successively storing an equivalent characteristic state in each cell of multi-cell memory devices 105 in stages, based on the cell's current characteristic state, or directly storing the desired characteristic state of each cell of multi-cell memory devices 105, based on an ordering of desired characteristic states of cells of the multi-cell memory devices. The equivalent characteristic state and a cell's current characteristic state, in one embodiment, can include at least one of a value of threshold voltage, current, gain, electric field, body effect, change in threshold voltage, resistance, impedance, inductance, temperature coefficient, or change in current. Step component 130 can gradate the equivalent characteristic state between successive storage stages.

Figure 3:
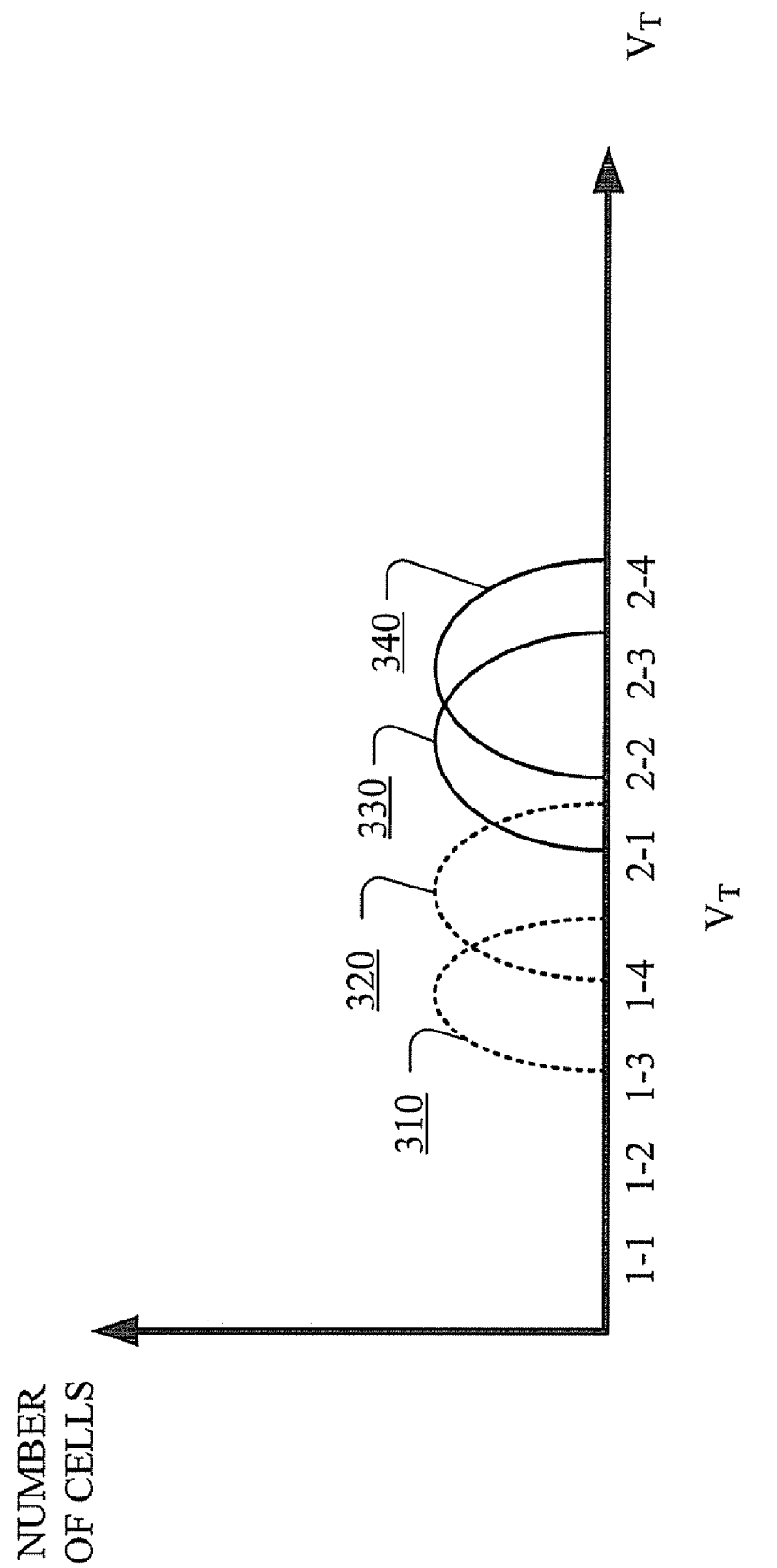
FIG. 3 illustrates an example of overlapping state distributions of characteristics stored in quad-bit, dual-cell memory devices indeterministically disturbed as a result of conventional storage methods.
Figure 4:
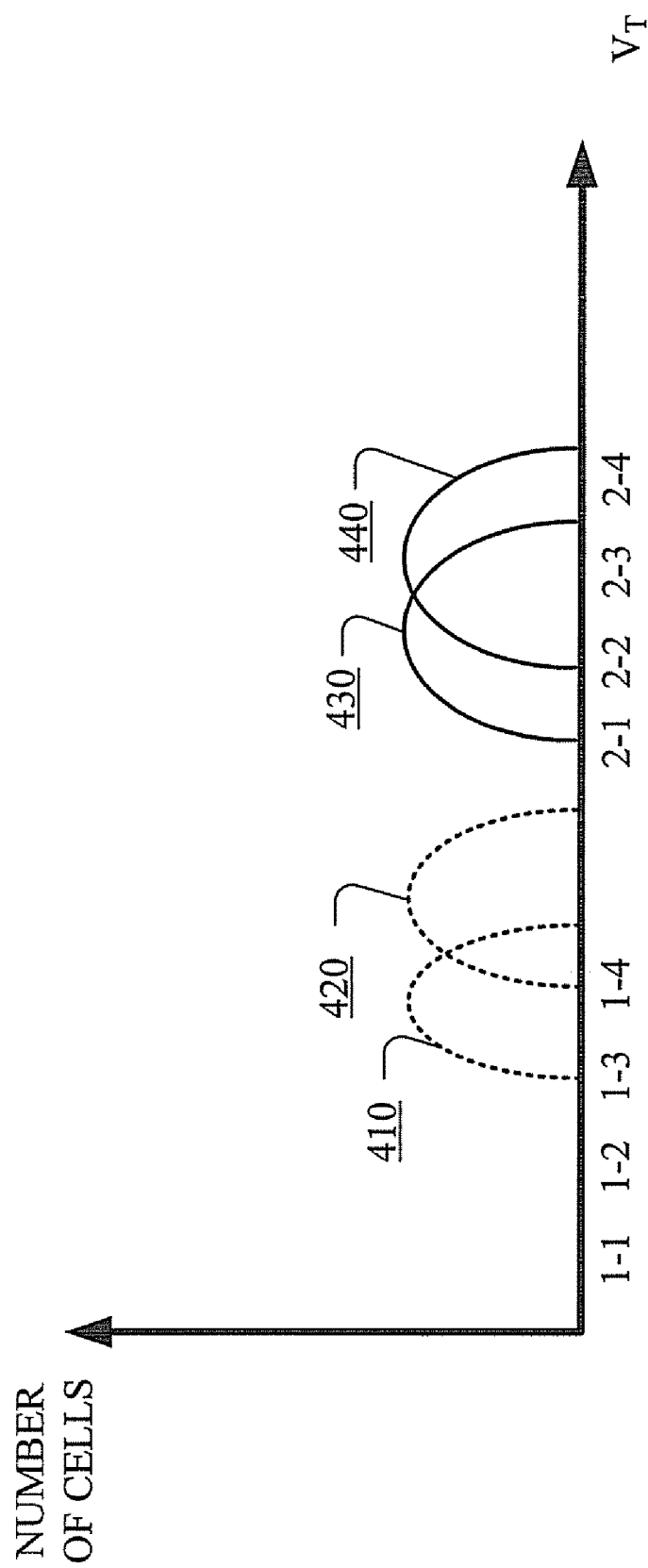
FIG. 4 illustrates threshold voltage state distributions of memory devices rendered non-overlapped as a result of intelligently controlling disturb of the cells, in accordance with an embodiment of the invention.

When an equivalent characteristic state is stored in a memory cell during a storage stage, the equivalent characteristic state becomes an intermediate characteristic state of the memory cell (e.g., intermediate level of charge, current, voltage, or other level corresponding to a digital piece of information) if the memory cell has yet to be, e.g., programmed/erased to its desired programmed/erased state. As illustrated by FIGS. 3 and 4, the subject invention can deterministically control the degree of shifting in distributions of desired characteristic states, e.g., shifting caused by adjacent cells being programmed/erased at substantially different threshold voltage levels, by iteratively programming/erasing memory cells in stages, or by directly programming the desired characteristic state into each cell of the plurality of multi-cell memory devices based on an ordering of the desired programmed states of the memory cells (or by directly erasing each cell of the plurality of multi-cell memory devices based on the ordering of the desired erased states of the memory cells).

FIG. 3 illustrates an example of overlapping state distributions of programmed quad-bit, dual-cell memory devices indeterministically disturbed as a result of conventional programming methods. It should be appreciated by those skilled in the art that overlapping state distributions can result from indeterministically disturbing quad-bit, dual-cell memory devices during erasure of some of the memory devices. State distributions 310 and 320 correspond to first cells of the dual-cell memory devices programmed to a first program state ($V_T$ level), with adjacent cells programmed to a third and fourth program state, respectively. Such state distributions can also be referred to as 1-3 and 1-4 distributions, respectively. State distributions 330 and 340 correspond to first cells of the dual-cell memory devices programmed to a second program state ($V_T$ level), with adjacent cells programmed to a first and second state, respectively. Such state distributions can also be referred to as 2-1 and 2-2 distributions.

As illustrated by FIG. 3, threshold voltage distribution 320 overlaps with threshold voltage distribution 330. As stated above, such overlap in state distributions can occur when a group of memory cells is programmed at a high $V_T$ level, current level, etc., that is substantially different from a programmed (or un-programmed) $V_T$ level, current level, etc., of adjacent memory cells. In addition, as illustrated by FIG. 3, such overlap in state distributions can even occur when a group of memory cells is programmed at states that are not substantially different from programmed states of adjacent memory cells (e.g., 2-1 and 2-2 distributions).

Figure 5:
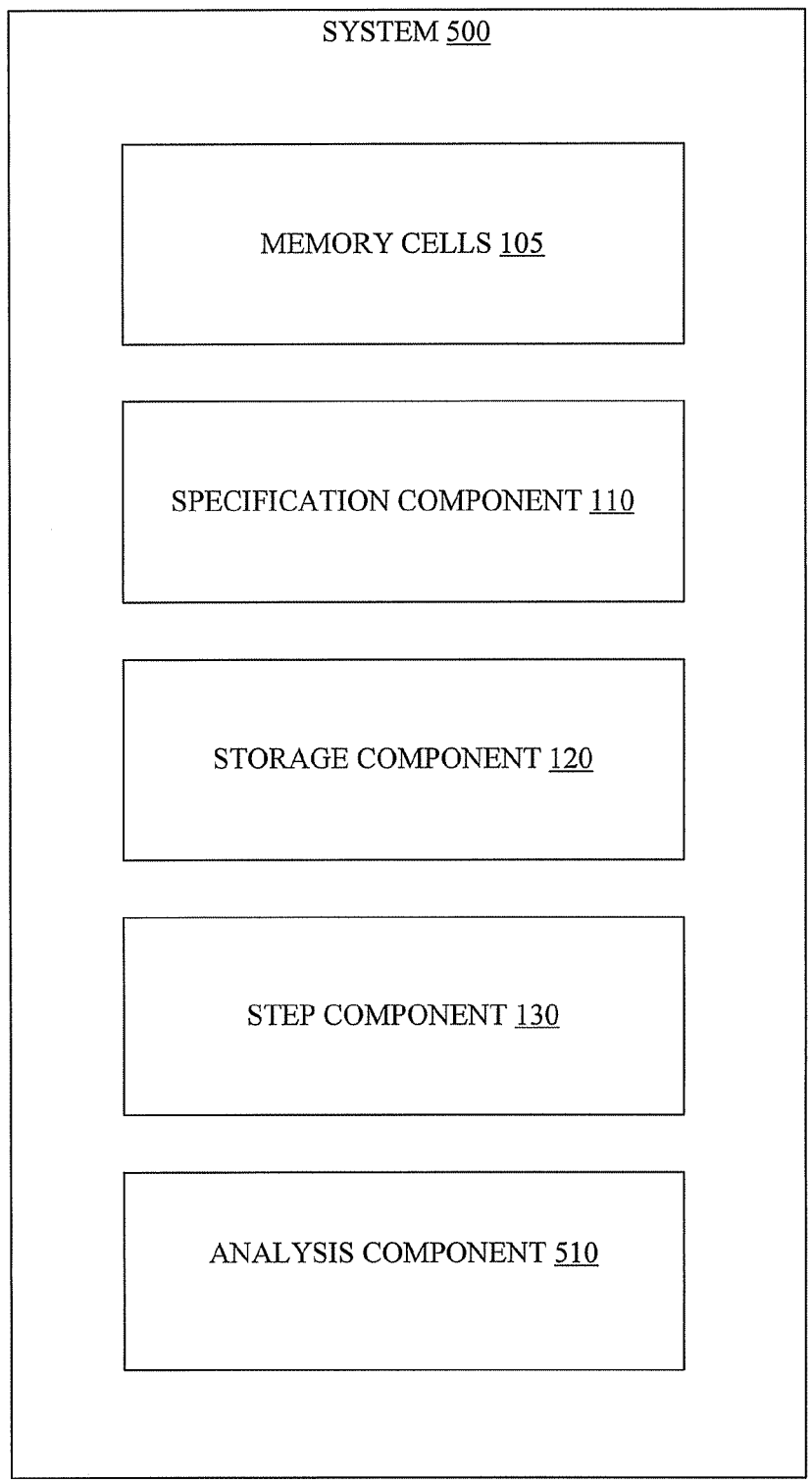
FIG. 5 illustrates an analysis component that can determine a size of gradation of the equivalent characteristic state, in accordance with an embodiment of the invention.

Comparatively, FIG. 4, in accordance with an embodiment of the invention, illustrates threshold voltage state distributions 420 and 430 of the programmed quad-bit, dual-cell memory devices rendered non-overlapped as a result of intelligently controlling program disturb of the cells. As illustrated by FIG. 4, by intermediately programming cells at an equivalent characteristic state in stages, or by directly storing a memory cell's desired characteristic state as a function of an ordering of desired characteristic states of the multi-cell memory devices, the subject invention can deterministically control memory cell disturb during device programming. In another embodiment, an equivalent characteristic state can be intermediately erased from the cells in stages, or a memory cell's desired characteristic state can be directly erased as a function of an ordering of desired characteristic states of the multi-cell memory devices. In one embodiment illustrated by FIG. 5, an analysis component 510 can determine a size of gradation of the equivalent characteristic state. The size of the gradation can be a change in level of charge, current, voltage, or other level of a characteristic corresponding to a digital piece of information.

Figure 6:
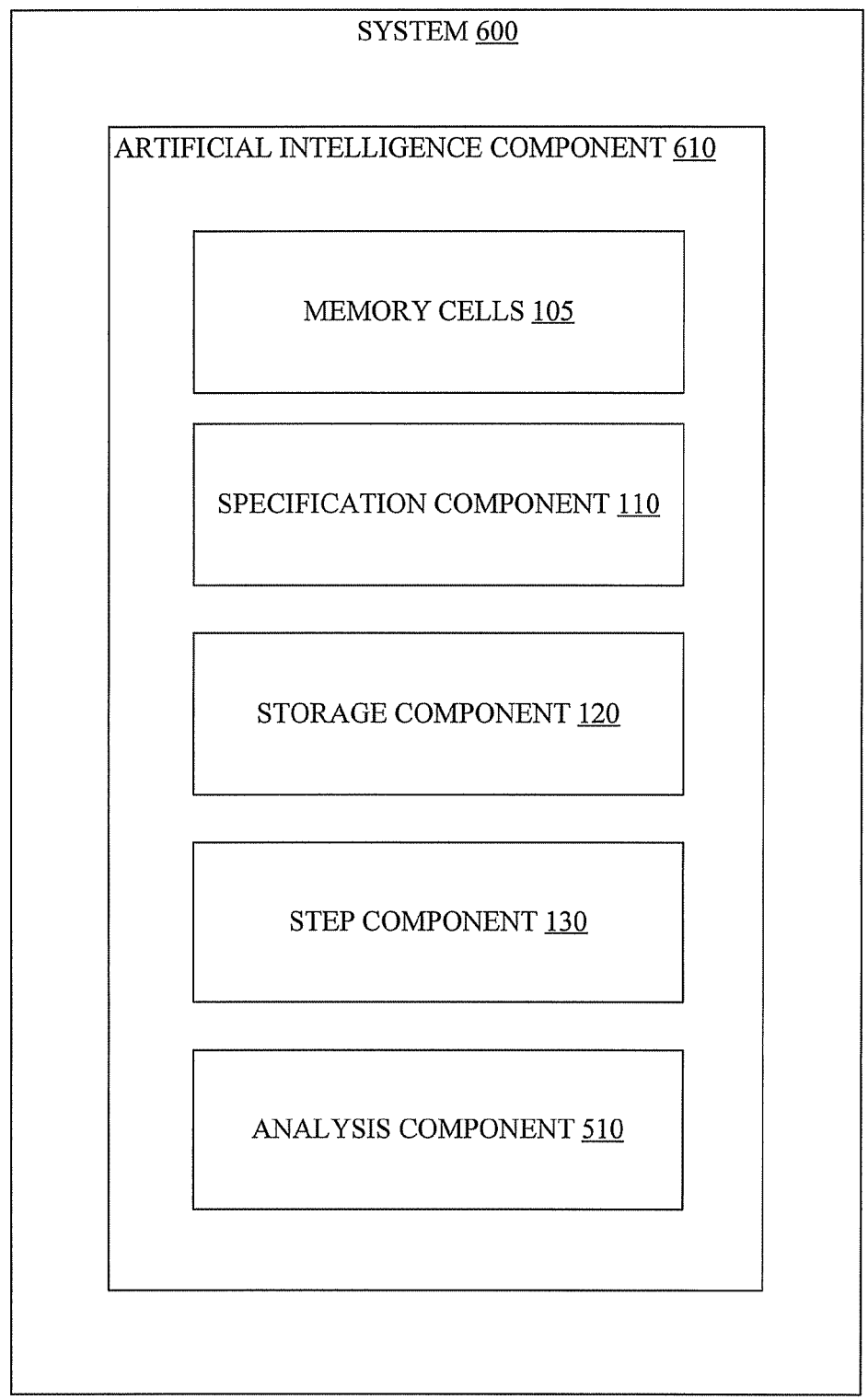
FIG. 6 illustrates an artificial intelligence component, in accordance with an embodiment of the invention.

In another embodiment, the gradation can include a linear or non-linear gradation. For example, under a linear gradation, the equivalent characteristic state can be changed by the same step size (e.g., changed by the same level of charge, current, voltage, or other level of a characteristic corresponding to a digital piece of information) between storage stages. Alternatively, under a non-linear gradation, the equivalent characteristic state can be changed as a function of one or more measured memory cell characteristics. Further, an artificial intelligence component 610, in an embodiment illustrated by FIG. 6, can automatically store characteristic states in the plurality of multi-cell memory devices 105 in stages, and either automatically determine the size of gradation of the equivalent characteristic state between stages or automatically order direct storage of the desired characteristic states of the multi-cell memory devices 105.

For example, artificial intelligence component 610 can automatically determine the size of gradation between stages based on, at least in part, one or more characteristics associated with at least one memory cell's current state (e.g., level of charge, current, voltage, or other level corresponding to a digital piece of information). In this way, by automatically determining the size of gradation between stages, e.g., based on a measured threshold voltage of adjacent cells, artificial intelligence component 610 can intelligently control overlap of threshold voltage distributions between adjacent cells, enhancing device reliability.

Figure 7:
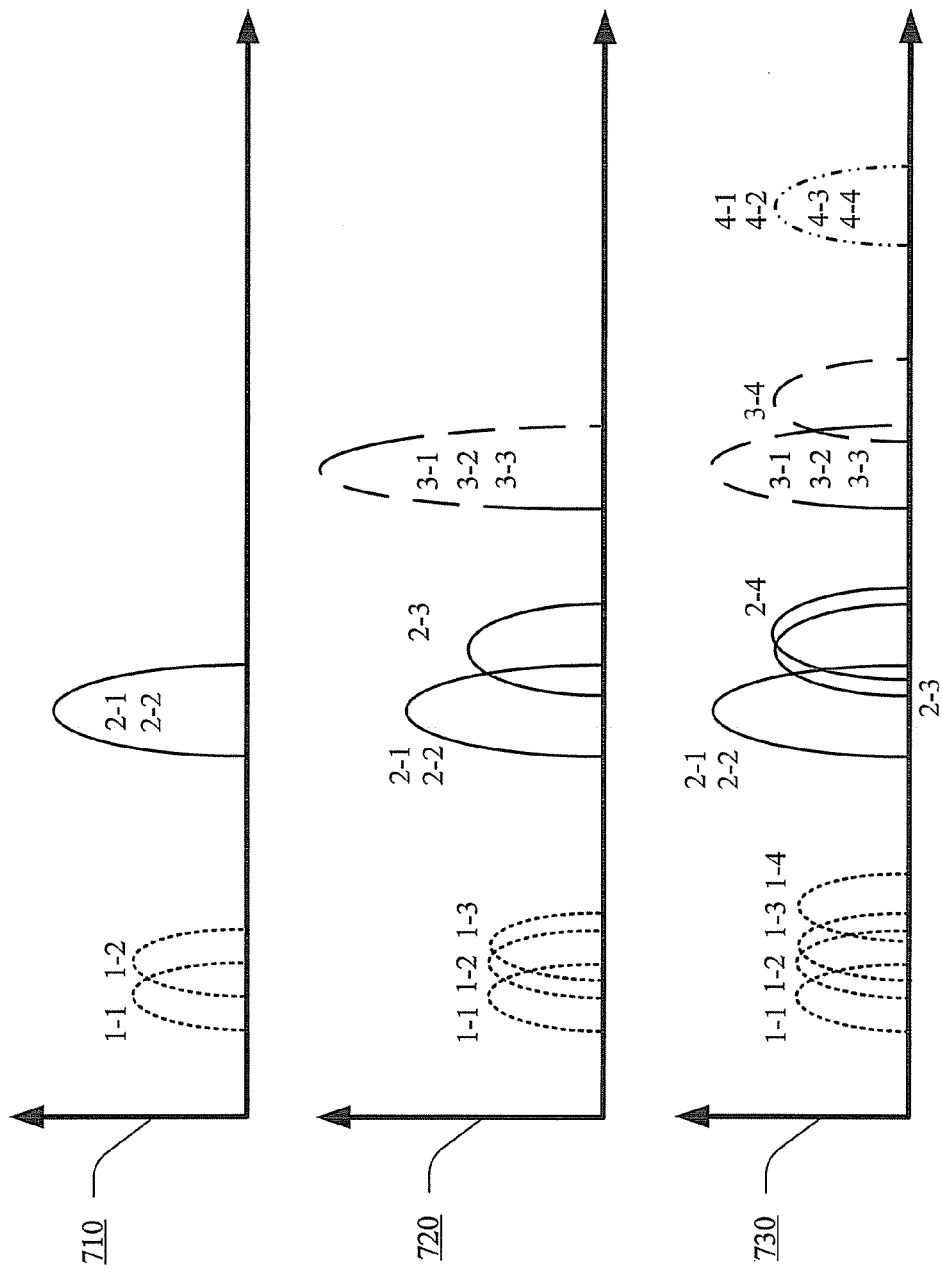
FIG. 7 illustrates an exemplary state diagram of memory cells in which characteristics were incrementally stored, in accordance with an embodiment of the invention.

In another embodiment, illustrated by exemplary state diagram FIG. 7, step component 130 can incrementally and/or decrementally gradate the equivalent characteristic state stored in multi-cell memory devices 105. FIG. 7 illustrates state distributions depicted on a graph of threshold voltage (x-axis) versus number of cells (y-axis). The state distributions correspond to threshold voltage levels of memory cells of quad-bit, dual-cell memory devices—each state distribution corresponding to one of four discrete logic levels (e.g., level 1, level 2, level 3, and level 4). Level 1 can correspond to a first programmed (or unprogrammed) threshold voltage (e.g., a lowest amount of threshold voltage, a default threshold voltage level, or combinations thereof). In addition, level 2 can correspond to a programmed/erased state representing a higher threshold voltage than the threshold voltage associated with level 1.

Moreover, level 3 can correspond to a programmed/erased state associated with a threshold voltage higher than the threshold voltages associated with level 1 and level 2, while level 4 can correspond to a highest programmed/erased state having a threshold voltage higher than the threshold voltages associated with level 1, level 2, and level 3. It should be appreciated that the four discrete logic levels can also represent, conversely, a decreasing order of threshold voltages or other programmed characteristics, e.g., level 1 corresponding to a higher threshold voltage than the threshold voltage associated with level 2, etc. Therefore, multi-cell memory devices 105 can represent a total of 16 state distributions associated with programmed/erased levels of threshold voltage or other memory cell characteristics (e.g., current, gain, electric field, body effect, resistance, impedance, inductance, temperature coefficient, etc.).

Returning now to the embodiment illustrated by FIG. 7, program component 120 can successively store an equivalent characteristic state in first and/or second cells of multi-cell memory devices 105 when the current characteristic state of a first/second cell is not equal to the first/second cell's desired characteristic state. Further, step component 130 can incrementally and/or decrementally gradate the equivalent characteristic state between stages, allowing storage component 120 to successively store higher/lower intermediate states in cells until the cells have been programmed/erased to their desired storage state. For example, the intermediate states can correspond to successively higher/lower intermediate threshold voltages.

As illustrated by FIG. 7, storage component 120 can first program memory cells (e.g., first and/or second memory cells of multi-cell memory devices 105) to a level 2 state, the first/second memory cells having desired programmed threshold voltages greater than or equal to threshold voltages corresponding to the level 2 state. State distribution group 710 includes distributions of these first/second cells programmed to the level 2 programming state (i.e., 1-2, 2-1, and 2-2 distributions).

Storage component 120 can continue to successively program memory cells having desired programmed threshold voltages greater than or equal to threshold voltages corresponding to a level 3 programming state and level 4 programming state, respectively. State distribution group 720 includes distributions of first/second cells programmed to threshold voltages associated with the level 3 programming state (i.e., 1-3, 2-3, 3-1, 3-2, and 3-3 distributions), while state distribution group 730 includes distributions of first/second cells programmed to threshold voltages associated with the level 4 programming state (i.e., 1-4, 2-4, 3-4, 4-1, 4-2, 4-3, and 4-4 distributions). As described above, such control over program disturb of memory cells can either reduce the overlap of distributions of electrical characteristics associated with different bits of one or more memory cells to reduce memory cell read errors, or allow an intelligent overlap of distributions that would allow intelligent read algorithms to accurately extract the actual data and reduce memory cell read errors.

Figure 8:
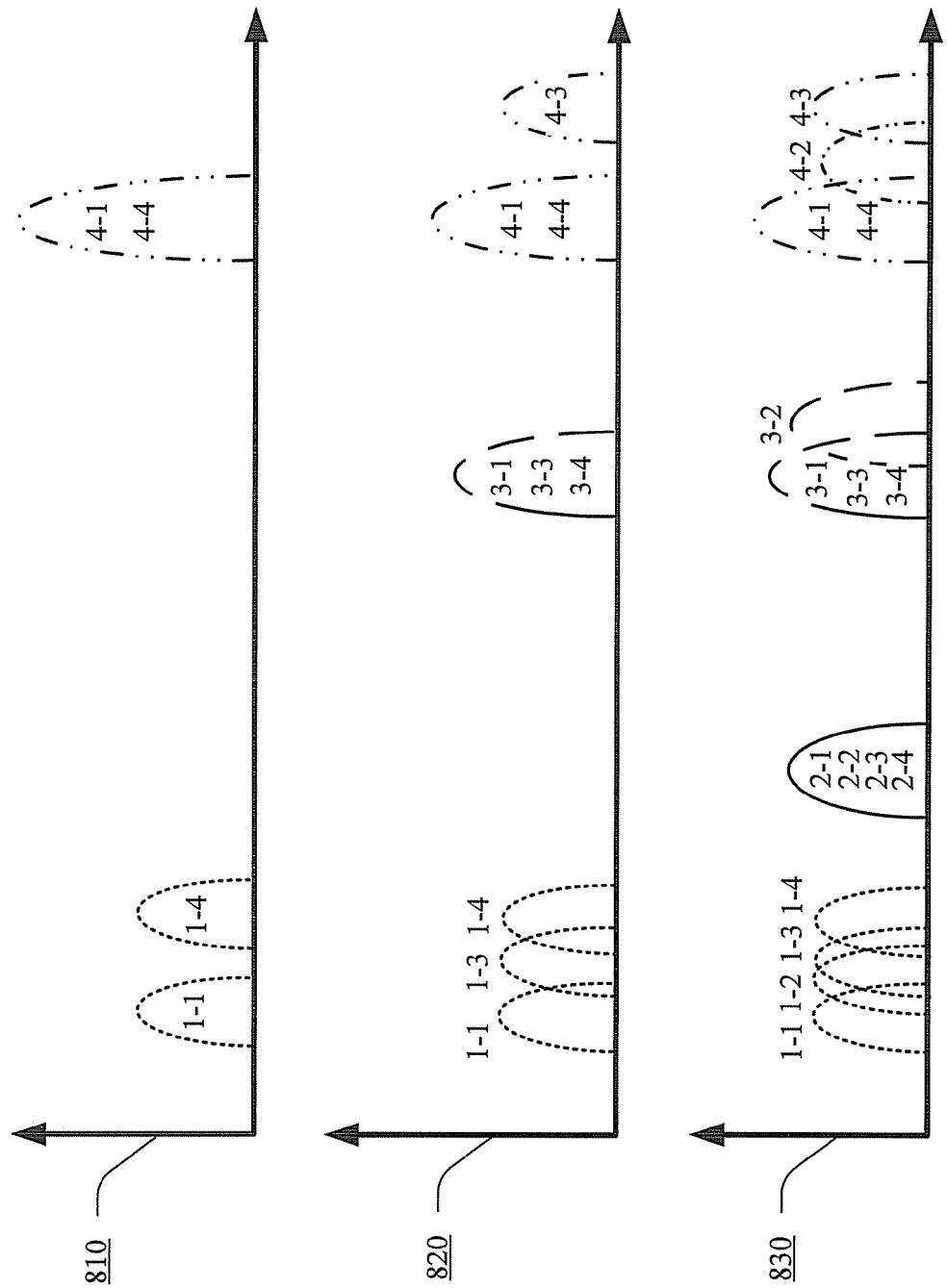
FIG. 8 illustrates an exemplary state diagram of memory cells in which desired characteristics were directly stored in order from highest to lowest desired characteristic states, in accordance with an embodiment of the invention.

Alternatively, storage component 120 can directly store the desired characteristic state of memory cells in order of desired characteristic states of the plurality of multi-cell memory devices 105. In the embodiment illustrated by FIG. 8, storage component 120 can directly program the desired program state of memory cells in order from highest desired programmed states to lowest desired programmed states of the plurality of multi-cell memory devices 105. In other embodiments, storage component 120 can directly program the desired program state of memory cells in order from lowest to highest desired programmed states of the plurality of multi-cell memory devices 105. As illustrated by FIG. 8, storage component can first program first/second memory cells to a level 4 programming state, corresponding to the highest desired programmed state associated with the highest desired programmed threshold voltage or other characteristic. It should be appreciated that, alternatively, a highest desired programmed state can be associated with the lowest desired programmed threshold voltage or other characteristic. State distribution group 810 includes distributions of these first/second cells programmed to the level 4 programming state (i.e., 1-4, 4-1, and 4-4 distributions).

Next, storage component 120 can program first/second memory cells to a level 3 programming state, corresponding to the next highest desired programmed state associated with the next highest desired programmed threshold voltage or other characteristic. It should be appreciated that, alternatively, a next highest desired programmed state can be associated with the next lowest desired programmed threshold voltage or other characteristic. In other embodiments, storage component 120 can program first/second memory cells to a state corresponding to the next lowest desired programmed state associated with the next lowest desired programmed threshold voltage or other characteristic. State distribution group 820 includes distributions of these first/second cells programmed to the level 3 programming state (i.e., 1-3, 3-1, 3-3, 3-4, and 4-3 distributions). Continuing, storage component 120 can program first/second memory cells to a level 2 programming state—the next highest desired programmed state. State distribution group 830 includes distributions of these first/second cells programmed to the level 2 programmed state (i.e., 1-2, 2-1, 2-2, 2-3, 2-4, 3-2, and 4-2 distributions).

Finally, storage component 120 can program first/second memory cells to a level 1 programming state, corresponding to a lowest programmed state associated with the lowest desired programmed threshold voltage or other characteristic. It should be appreciated that, alternatively, the lowest desired programmed state can be associated with the highest desired programmed threshold voltage or other characteristic. State distribution groups 810-830 include distributions of these first/second cells programmed to the level 1 programmed state (i.e., 1-1, 1-2, 1-3, 1-4, 2-1, 3-1, and 4-1 distributions). It should be appreciated that a default state (e.g., unprogrammed state) may correspond to the lowest programmed, or level 1, state—therefore, program component need not program memory cells to a level 1 state. As stated previously, the described systems and methods provide for increased memory device reliability and reduced read errors by intelligently controlling program disturb of memory devices.

Figure 9:
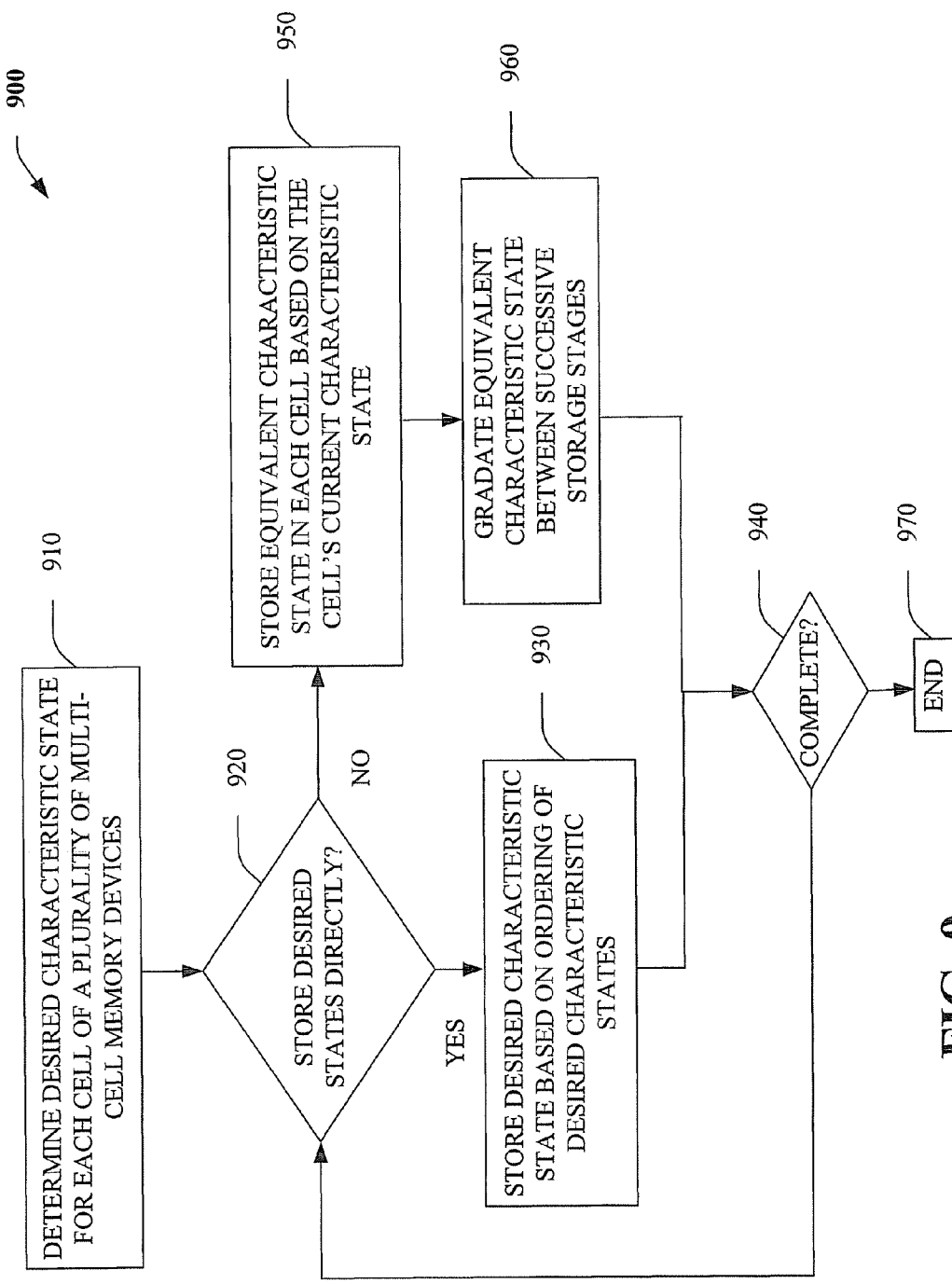
FIG. 9 illustrates a high level flowchart of an example methodology for intelligently disturbing memory cells during storage of desired characteristic states to obtain optimal cell distributions, in accordance with an embodiment of the invention.
Figure 10:
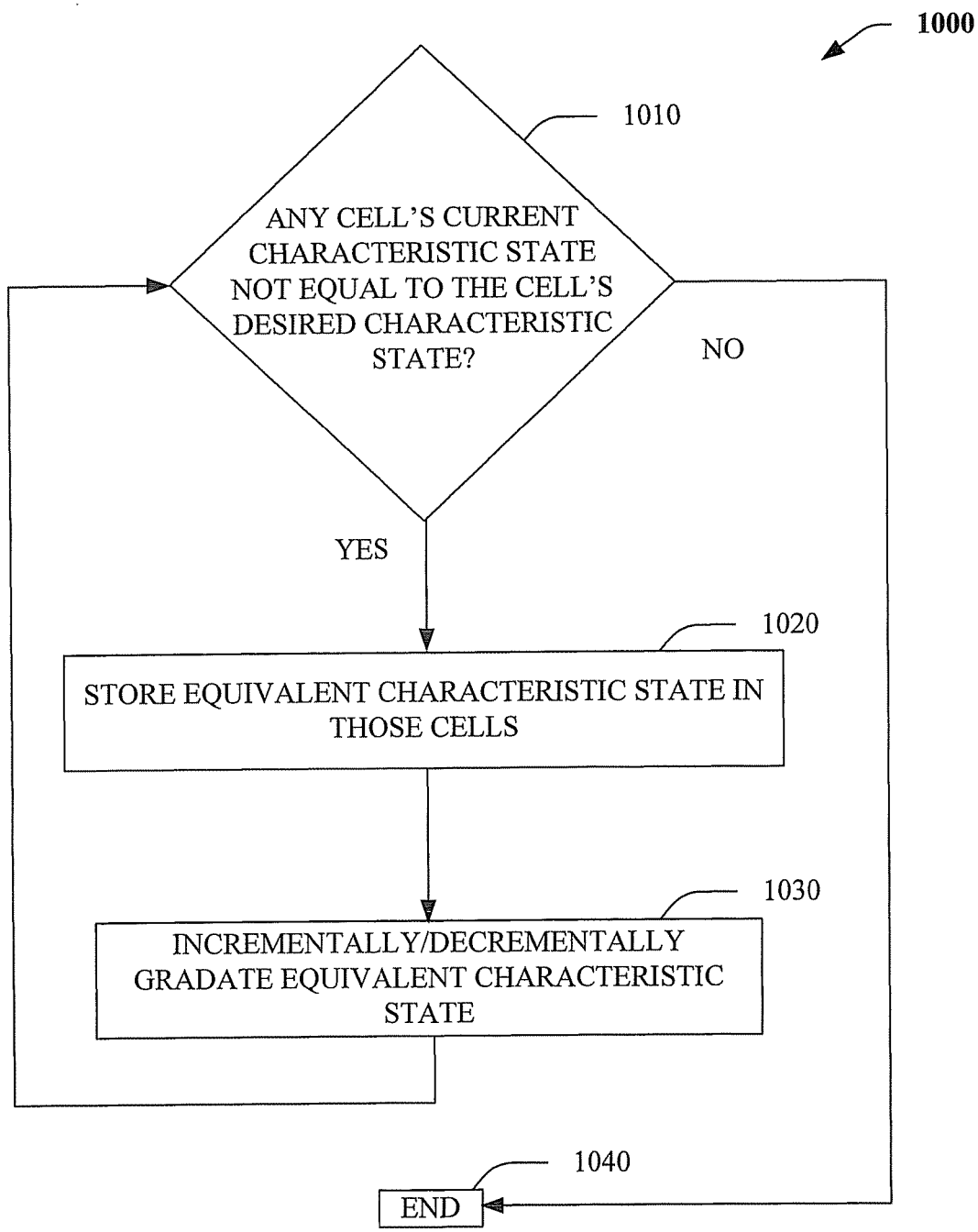
FIG. 10 illustrates another exemplary flowchart of an example methodology for intelligently disturbing memory cells during storage of desired characteristic states to obtain optimal cell distributions, in accordance with an embodiment of the invention.
Figure 11:
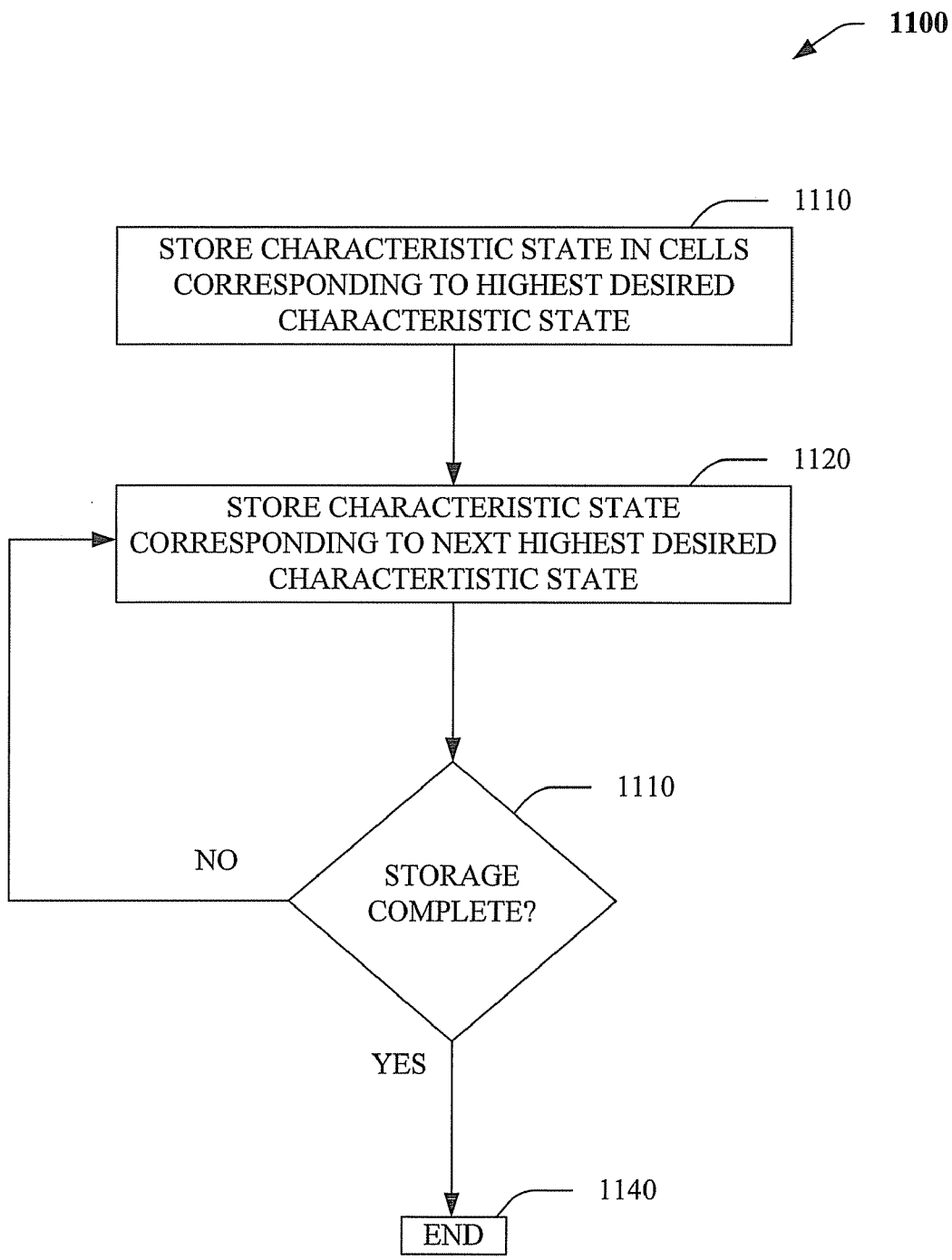
FIG. 11 illustrates an exemplary flowchart of another example methodology for intelligently disturbing memory cells during storage of desired characteristic states to obtain optimal cell distributions, in accordance with an embodiment of the invention.

FIGS. 9-11 illustrate example methodologies in accordance with the disclosed subject matter. For purposes of simplicity of explanation, the methodologies are depicted and described as a series of acts. It is to be understood and appreciated that the claimed subject matter is not limited by the acts illustrated and/or by the order of acts, for acts associated with the example methodologies can occur in different orders and/or concurrently with other acts not presented and described herein. For example, those skilled in the art will understand and appreciate that a methodology could alternatively be represented as a series of interrelated states or events, such as in a state diagram. Moreover, not all illustrated acts can be required to implement a methodology in accordance with the claimed subject matter. Additionally, it should be further appreciated that the methodologies disclosed hereinafter and throughout this specification are capable of being stored on an article of manufacture to facilitate transporting and transferring such methodologies to computers.

FIG. 9 depicts a high level flowchart of an example methodology 900 for intelligently disturbing memory cells during storage of desired characteristic states to obtain optimal cell distributions, in accordance with an embodiment of the invention. At 910, specification component 110 can determine a desired characteristic state for each cell of multi-cell memory devices 105. In one embodiment, the desired characteristic state for each cell can include at least one of a value of threshold voltage, current, gain, electric field, body effect, change in threshold voltage, resistance, impedance, inductance, temperature coefficient, or change in current. At 920, it can be determined whether to directly store a desired characteristic state in cells of multi-cell memory devices 105, based on an order of desired characteristic states of the plurality of multi-cell memory devices 105. If it is determined that the desired characteristic state of multi-cell memory devices 105 will be directly stored, the desired characteristic state of the multi-cell memory devices can be stored based on an order of desired characteristic states of the multi-cell memory devices 105 at 930.

In one embodiment, methodology 900 can directly store the desired characteristic state of cells of the multi-cell memory devices in order from highest desired characteristic states to lowest desired characteristic states. As described above, highest desired characteristic states can correspond to a highest desired stored threshold voltage or other characteristic. It should be appreciated that, alternatively, a highest desired characteristic state can be associated with the lowest desired stored threshold voltage or other characteristic. In other embodiments, the desired characteristic state of cells of the multi-cell memory devices can be stored in order from lowest desired characteristic states to highest desired characteristic states. If it is determined that memory cell storage of desired characteristic states is complete at 940, methodology 900 ends at 970, else flow returns to 920.

If it was determined that desired characteristic states would not be directly stored in memory cells, flow continues from 920 to 950, in which storage component 120 successively stores an equivalent characteristic state in each cell of the plurality of multi-cell memory devices, based on a cell's current characteristic state. The equivalent characteristic state and a cell's current characteristic state, in one embodiment, can include at least one of a value of threshold voltage, current, gain, electric field, body effect, change in threshold voltage, resistance, impedance, inductance, temperature coefficient, or change in current. When an equivalent characteristic state is stored in a memory cell during a storage stage, the equivalent characteristic state becomes an intermediate characteristic state of the memory cell (e.g., intermediate level of charge, current, voltage, or other level corresponding to a digital piece of information) if the desired characteristic state of the memory cell has yet to be stored in the memory cell.

In one embodiment, cells of multi-cell memory devices 105 can be programmed/erased during a programming/erasing stage when the current characteristic state of a cell is not equal to the cell's desired characteristic state. After programming/erasing cells during a programming/erasing stage, step component 130 can incrementally and/or decrementally gradate the equivalent characteristic state between stages, allowing storage component 120 to successively program/erase higher/lower intermediate states in cells until the cells have been programmed/erased to their desired characteristic states. If storage is complete, methodology 900 ends at 970, else continues to 920, and thus to 950.

FIG. 10 depicts a high level flowchart of an example methodology 1000 for intelligently disturbing memory cells during storage of desired characteristic states to obtain optimal cell distributions, in accordance with an embodiment of the invention. In the embodiment illustrated by FIG. 10, methodology 1000 can successively program an equivalent characteristic state in each cell of the plurality of multi-cell memory devices 105. At 1010, it is determined whether the current characteristic state of each cell of the plurality of multi-cell memory devices 105 is equal to its desired characteristic state. If so, methodology 1000 ends at 1040, else flow continues to 1020, in which storage component 120 stores the equivalent characteristic state in a cell if the cell's current characteristic state is not equal to the cell's desired characteristic state. At 1030, step component incrementally and/or decrementally gradates the equivalent characteristic state. Flow repeats to 1010, in which the equivalent characteristic state is successively and incrementally/decrementally gradated, and stored in memory cells, until each cell's current characteristic state is equal to the cell's desired characteristic state.

Alternatively, FIG. 11 depicts a high level flowchart of an example methodology 1100 for deterministically disturbing memory cells during storage of desired characteristic states, in accordance with an embodiment of the invention. In the embodiment illustrated by FIG. 11, methodology 1100 can directly store the desired characteristic state of cells of the multi-cell memory devices in order from highest desired characteristic states to lowest desired characteristic states. As described above, highest desired characteristic states can correspond to a highest desired programmed threshold voltage or other characteristic. It should be appreciated that, alternatively, a highest desired programmed state can be associated with a lowest desired programmed threshold voltage or other characteristic. Further, a highest desired characteristic state can correspond to a highest or lowest desired erased threshold voltage or other characteristic. Moreover, in other embodiments, the desired characteristic state of cells of the multi-cell memory devices can be stored in order from lowest desired characteristic states to highest desired characteristic states.

At 1110, storage component 120 can first store a characteristic state in memory cells corresponding to the highest desired characteristic state, e.g., associated with the highest desired programmed threshold voltage or other characteristic. Continuing to 1120, storage component 120 can next store a characteristic state in memory cells corresponding to the next highest desired characteristic state, e.g., next highest (or lowest) threshold voltage or other characteristic. If storage is complete at 1130, methodology 1100 completes storing desired characteristic states at 1140, else storage component 120 continues to 1120, storing characteristic states in cells corresponding to the next highest desired characteristic state. In other embodiments, a characteristic state corresponding to the lowest desired characteristic state, e.g., associated with the lowest desired programmed threshold voltage or other characteristic, can be stored in the memory cells. Further, a characteristic state can next be stored in the memory cells, the next characteristic state corresponding to the next lowest desired characteristic state, e.g., next highest/lowest threshold voltage or other characteristic.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Moreover, the word "exemplary" is used herein to mean serving as an example, instance, or illustration. Any aspect or design described herein as "exemplary" is not necessarily to be construed as preferred or advantageous over other aspects or designs. Additionally, some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 12:
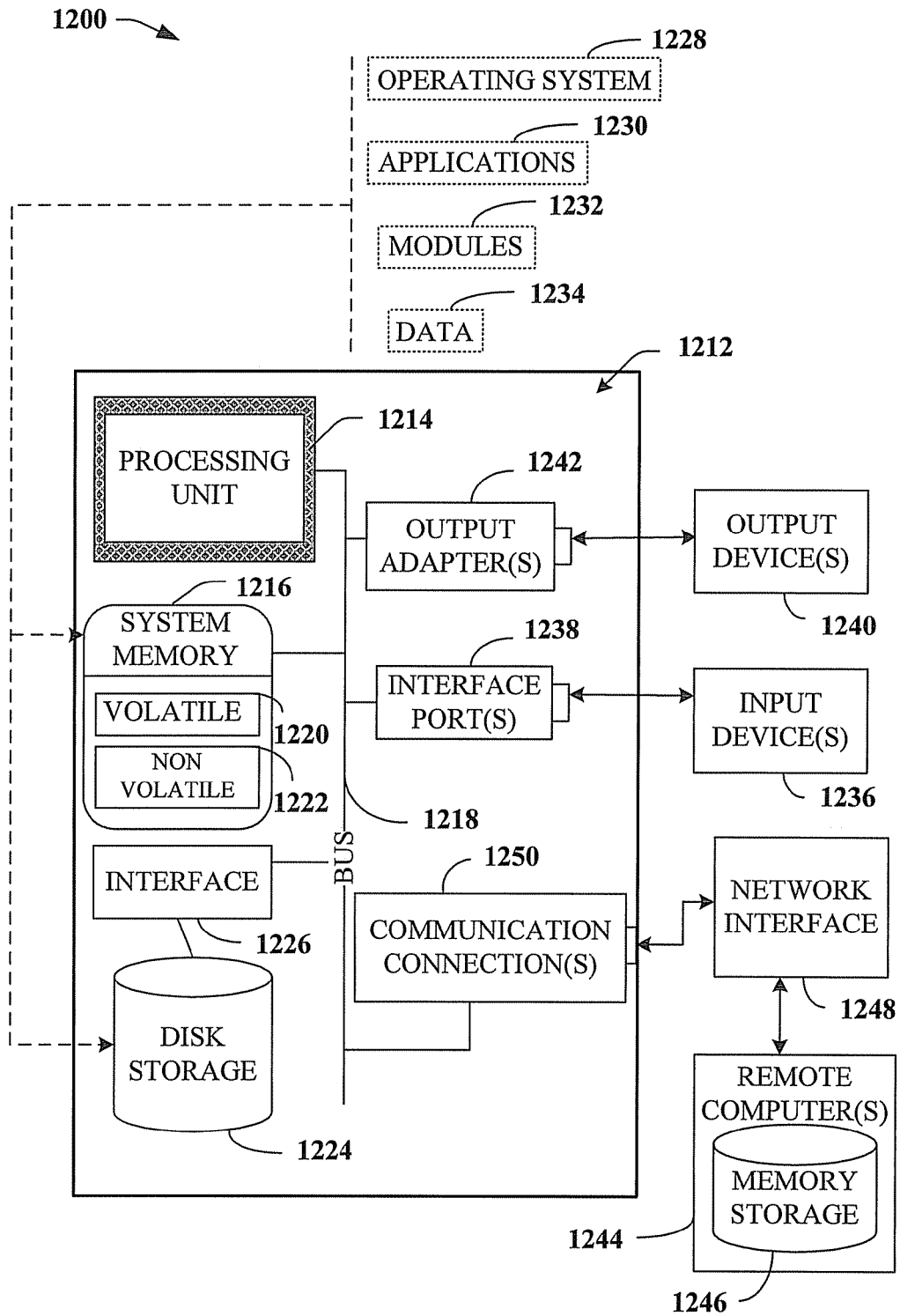
FIG. 12 is a schematic block diagram illustrating a suitable operating environment.
Figure 13:
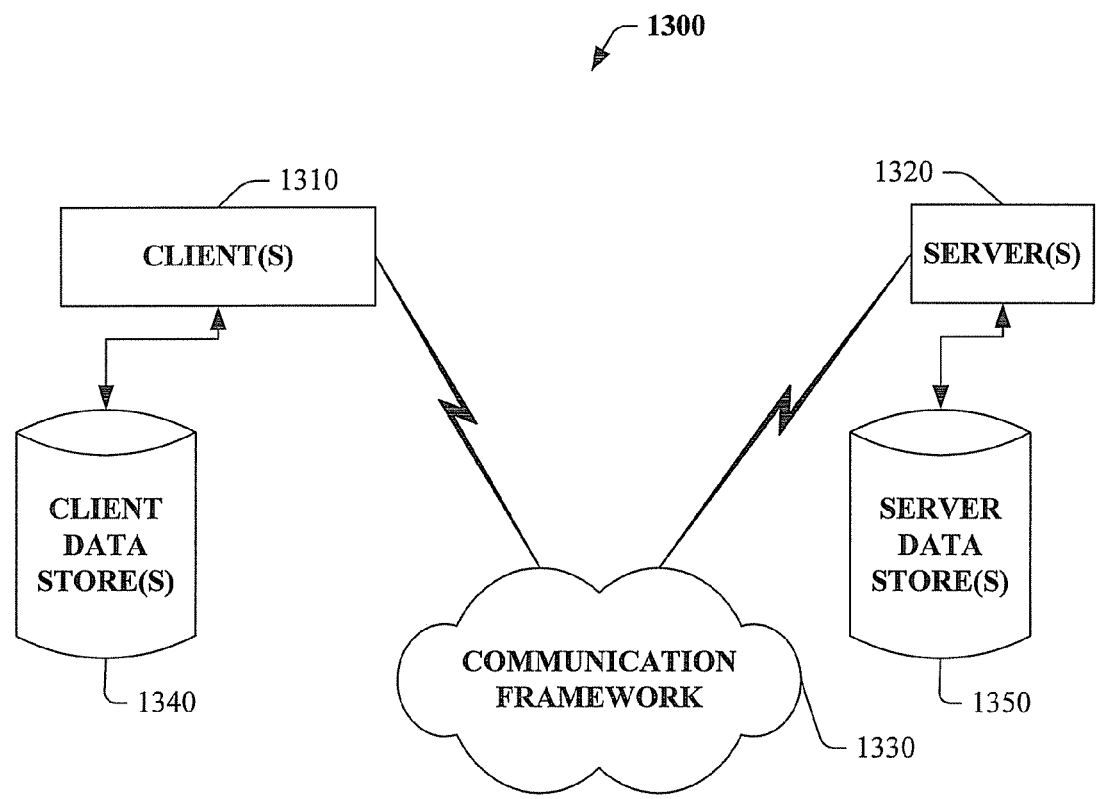
FIG. 13 is a schematic block diagram of a sample-computing environment.

In order to provide a context for the various aspects of the disclosed subject matter, FIGS. 12 and 13, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 12, a suitable environment 1200 for implementing various aspects of the claimed subject matter can include a computer 1212. The computer 1212 includes a processing unit 1214, a system memory 1216, and a system bus 1218. The system bus 1218 couples system components including, but not limited to, the system memory 1216 to the processing unit 1214. The processing unit 1214 can be any of various available processors. Dual microprocessors and other multiprocessor architectures also can be employed as the processing unit 1214.

The system bus 1218 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1216 includes volatile memory 1220 and nonvolatile memory 1222. The basic input/output system (BIOS), containing the basic routines to transfer information between elements within the computer 1212, such as during start-up, is stored in nonvolatile memory 1222. By way of illustration, and not limitation, nonvolatile memory 1222 can include ROM, PROM, electrically programmable ROM (EPROM), electrically erasable programmable ROM (EEPROM), or flash memory. Volatile memory 1220 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1212 also includes removable/non-removable, volatile/non-volatile computer storage media. FIG. 12 illustrates, for example, disk storage 1224. Disk storage 1224 includes, but is not limited to, devices like a magnetic disk drive, floppy disk drive, tape drive, Jaz drive, Zip drive, LS-100 drive, flash memory card, or memory stick. In addition, disk storage 1224 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1224 to the system bus 1218, a removable or non-removable interface is typically used, such as interface 1226.

It is to be appreciated that FIG. 12 describes software that acts as an intermediary between users and the basic computer resources described in the suitable operating environment 1200. Such software includes an operating system 1228. Operating system 1228, which can be stored on disk storage 1224, acts to control and allocate resources of the computer system 1212. System applications 1230 take advantage of the management of resources by operating system 1228 through program modules 1232 and program data 1234 stored either in system memory 1216 or on disk storage 1224. It is to be appreciated that the disclosed subject matter can be implemented with various operating systems or combinations of operating systems.

A user enters commands or information into the computer 1212 through input device(s) 1236. Input devices 1236 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1214 through the system bus 1218 via interface port(s) 1238. Interface port(s) 1238 include, for example, a serial port, a parallel port, a game port, and a universal serial bus (USB). Output device(s) 1240 use some of the same type of ports as input device(s) 1236. Thus, for example, a USB port may be used to provide input to computer 1212 and to output information from computer 1212 to an output device 1240. Output adapter 1242 is provided to illustrate that there are some output devices 1240 like monitors, speakers, and printers, among other output devices 1240, which require special adapters. The output adapters 1242 include, by way of illustration and not limitation, video and sound cards that provide a means of connection between the output device 1240 and the system bus 1218. It should be noted that other devices and/or systems of devices provide both input and output capabilities such as remote computer(s) 1244.

Computer 1212 can operate in a networked environment using logical connections to one or more remote computers, such as remote computer(s) 1244. The remote computer(s) 1244 can be a personal computer, a server, a router, a network PC, a workstation, a microprocessor based appliance, a peer device or other common network node and the like, and typically includes many or all of the elements described relative to computer 1212. For purposes of brevity, only a memory storage device 1246 is illustrated with remote computer(s) 1244. Remote computer(s) 1244 is logically connected to computer 1212 through a network interface 1248 and then physically connected via communication connection 1250. Network interface 1248 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1250 refers to the hardware/software employed to connect the network interface 1248 to the bus 1218. While communication connection 1250 is shown for illustrative clarity inside computer 1212, it can also be external to computer 1212. The hardware/software necessary for connection to the network interface 1248 includes, for exemplary purposes only, internal and external technologies such as, modems including regular telephone grade modems, cable modems and DSL modems, ISDN adapters, and Ethernet cards.

FIG. 13 is a schematic block diagram of a sample-computing environment 1300 with which the subject innovation can interact. The system 1300 includes one or more client(s) 1310. The client(s) 1310 can be hardware and/or software (e.g., threads, processes, computing devices). The system 1300 also includes one or more server(s) 1320. Thus, system 1300 can correspond to a two-tier client server model or a multi-tier model (e.g., client, middle tier server, data server), amongst other models. The server(s) 1320 can also be hardware and/or software (e.g., threads, processes, computing devices). The servers 1320 can house threads to perform transformations by employing the subject innovation, for example. One possible communication between a client 1310 and a server 1320 may be in the form of a data packet transmitted between two or more computer processes.

The system 1300 includes a communication framework 1330 that can be employed to facilitate communications between the client(s) 1310 and the server(s) 1320. The client(s) 1310 are operatively connected to one or more client data store(s) 1340 that can be employed to store information local to the client(s) 1310. Similarly, the server(s) 1320 are operatively connected to one or more server data store(s) 1350 that can be employed to store information local to the servers 1320.

What has been described above includes examples of the various embodiments. It is, of course, not possible to describe every conceivable combination of components or methodologies for purposes of describing the embodiments, but one of ordinary skill in the art may recognize that many further combinations and permutations are possible. Accordingly, the detailed description is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In this regard, it will also be recognized that the embodiments includes a system as well as a computer-readable medium having computer-executable instructions for performing the acts and/or events of the various methods. In addition, while a particular feature may have been disclosed with respect to only one of several implementations, such feature may be combined with one or more other features of the other implementations as may be desired and advantageous for any given or particular application.

What is claimed is:

1. A computer implemented system comprising a memory having stored therein computer executable components and a processor that executes the following computer executable components:
   a specification component that determines a desired characteristic state for each cell of a plurality of multi-cell memory devices;
   a storage component that, alternatively, successively stores an equivalent characteristic state in each cell of the plurality of multi-cell memory devices based on, at least in part, the cell's current characteristic state, or directly stores the desired characteristic state of each cell of the plurality of multi-cell memory devices based on, at least in part, an ordering of the desired characteristic states of cells of the multi-cell memory devices;
   a step component that gradates the equivalent characteristic state between successive storage stages, the gradation comprises at least one of a linear or non-linear gradation;
   an analysis component that determines a size of gradation of the equivalent characteristic state; and
   an artificial intelligence component that automatically stores characteristic states in the plurality of multi-cell memory devices and either automatically determines the size of gradation of the equivalent characteristic state or automatically orders direct storage of the desired characteristic states.

2. The system of claim 1, wherein the step component at least one of incrementally or decrementally gradates the equivalent characteristic state between successive storage stages.

3. The system of claim 1, wherein the storage component directly stores characteristic states in each cell of the plurality of multi-cell memory devices at least one of:
   in order from highest desired characteristic states to lowest desired characteristic states; or
   in order from lowest desired characteristic states to highest desired characteristic states.

4. The system of claim 1, wherein the storage component stores an equivalent characteristic state in each cell of the plurality of multi-cell memory devices based on whether a cell's current characteristic state is not equal to the cell's desired characteristic state.

5. The system of claim 1, wherein the desired characteristic state, equivalent characteristic state, and current characteristic state comprise at least one of a value of threshold voltage, current, gain, electric field, body effect, change in threshold voltage, resistance, impedance, inductance, temperature coefficient, or change in current.

6. The system of claim 1, wherein each memory device of the plurality of multi-cell memory devices is a non-volatile memory that is at least one of flash memory, multi-bit flash memory, multi-level flash memory, quad-bit flash memory, read only memory (ROM), programmable ROM (PROM), erasable programmable read only memory (EPROM), electronically erasable programmable read only memory (EEPROM), or a combination thereof.

7. The system of claim 1, wherein the desired characteristic state, equivalent characteristic state, and current characteristic state comprise a value of threshold voltage.

8. The system of claim 1, wherein the desired characteristic state, equivalent characteristic state, and current characteristic state comprise a change in threshold voltage.

9. The system of claim 1, wherein each memory device of the plurality of multi-cell memory devices is a non-volatile memory that is a multi-bit flash memory.

10. A computer implemented method comprising:
    selecting a desired characteristic state for each cell of a plurality of multi-cell memory devices;
    alternatively, storing an equivalent characteristic state in each cell of the plurality of multi-cell memory devices in consecutive storage stages based on, at least in part, a cell's current characteristic state or the cell's desired characteristic state, or directly storing the desired characteristic state of each cell of the plurality of multi-cell memory devices based on, at least in part, a sequencing of desired characteristic states of the plurality of multi-cell memory devices;
    gradating the equivalent characteristic state between the consecutive storage stages;
    determining a size of gradation of the equivalent characteristic state;
    automatically storing characteristic states in the plurality of multi-cell memory devices; and
    either automatically determining the size of gradation of the equivalent characteristic state or automatically sequencing direct storage of the desired characteristic states.

11. The method of claim 10, further comprising:
    at least one of incrementally or decrementally gradating the equivalent characteristic state between the consecutive storage stages.

12. The method of claim 10, further comprising:
    directly storing characteristic states in each cell of the plurality of multi-cell memory devices at least one of:
    in order from highest desired characteristic states of the plurality of multi-cell memory devices to lowest desired characteristic states of the plurality of multi-cell memory devices; or
    in order from lowest desired characteristic states of the plurality of multi-cell memory devices to highest desired characteristic states of the plurality of multi-cell memory devices.

13. The method of claim 10, further comprising storing the equivalent characteristic state in a cell during a storage stage based on whether the cell's current characteristic state is not equal to the cell's desired characteristic state.

14. The method of claim 10, wherein the desired characteristic state, equivalent characteristic state, and current characteristic state comprise a change in threshold voltage.

15. The method of claim 10, wherein the desired characteristic state, equivalent characteristic state, and current characteristic state comprise a change in current.

16. A computer-executable system comprising a memory having stored therein computer executable components and a processor that executes the following computer executable components:
- means for successively storing a desired characteristic state in each cell of a plurality of multi-cell memory devices, wherein a next characteristic state is stored in each cell of the plurality of multi-cell memory devices during a storage stage as a function of the cell's current characteristic state;
- means for directly storing the desired characteristic state of each cell of the plurality of multi-cell memory devices in progression of desired characteristic states of the plurality of multi-cell memory devices;
- means for changing a degree of change of the next characteristic state between successive storage stages;
- means for determining a size of degree of change of the next characteristic state, wherein the size of the degree of change of the next characteristic state is at least one of a linear or non-linear change;
- means for automatically storing characteristic states in each cell of the plurality of multi-cell memory devices;
- means for automatically determining the size of the degree of change of the next characteristic state, based on, at least in part, one or more characteristics associated with at least one memory cell; and
- means for automatically progressing an order of directly storing the desired characteristic states.

17. The system of claim 16, further comprising:
- means for at least one of increasing or decreasing the size of the degree of change of the next characteristic state; and
- means for at least one of:
- directly storing characteristic states in each cell of the plurality of multi-cell memory devices in order from highest desired characteristic states to lowest desired characteristic states of the plurality of multi-cell memory devices; or
- directly storing characteristic states in each cell of the plurality of multi-cell memory devices in order from lowest desired characteristic states to highest desired characteristic states of the plurality of multi-cell memory devices.

18. The system of claim 16, further comprising:
- means for storing the next characteristic state in a cell as a function of whether the cell's current characteristic state is not equal to the cell's desired characteristic state.

19. The system of claim 16, wherein the desired characteristic state, equivalent characteristic state, and current characteristic state comprise a value of threshold voltage.

20. The system of claim 16, wherein the desired characteristic state, equivalent characteristic state, and current characteristic state comprise a change in threshold voltage.

* * * * *